United States Patent
Yamaguchi et al.

(10) Patent No.: US 10,406,743 B2
(45) Date of Patent: Sep. 10, 2019

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Hiromitsu Yamaguchi, Yokohama (JP); Yasuyuki Tamura, Yokohama (JP); Yoshikazu Miyajima, Utsunomiya (JP); Akio Saito, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/124,458

(22) PCT Filed: Apr. 16, 2015

(86) PCT No.: PCT/JP2015/062315
§ 371 (c)(1),
(2) Date: Sep. 8, 2016

(87) PCT Pub. No.: WO2015/166870
PCT Pub. Date: Nov. 5, 2015

(65) Prior Publication Data
US 2017/0015045 A1    Jan. 19, 2017

(30) Foreign Application Priority Data
May 2, 2014    (JP) .................................. 2014-095502

(51) Int. Cl.
*B29C 59/02*    (2006.01)
*G03F 7/00*    (2006.01)
(Continued)

(52) U.S. Cl.
CPC .............. *B29C 59/022* (2013.01); *B05B 1/30* (2013.01); *B05B 12/02* (2013.01); *B05D 3/12* (2013.01);
(Continued)

(58) Field of Classification Search
None
See application file for complete search history.

(56) References Cited

U.S. PATENT DOCUMENTS 7,535,546 B2    5/2009    Okuyama
8,392,855 B2    3/2013    Morinaga et al.
(Continued)

FOREIGN PATENT DOCUMENTS

JP    2007326003 A    12/2007
JP    2011136540 A    7/2011
(Continued)

OTHER PUBLICATIONS

Jacek Majewski, Measurement techniques concerning droplet size distribution of electrosprayed water, PrzeglĄd Elektrotechniczny, ISSN 0033-2097, R. 89 NR 3b/2013.*
(Continued)

*Primary Examiner* — James Mellott
(74) *Attorney, Agent, or Firm* — Rossi, Kimms & McDowell LLP

(57) ABSTRACT

The present invention provides an imprint apparatus which forms a pattern in an imprint material supplied onto a substrate using a mold, the apparatus comprising a supply unit including a plurality of orifices each of which discharges the imprint material toward the substrate and configured to supply the imprint material onto the substrate by discharge of the imprint material from each orifice, and a control unit configured to control the discharge of the imprint material from each orifice in accordance with dis-
(Continued)

tribution information indicating a distribution, on the substrate, of the imprint material that should be supplied onto the substrate, wherein the control unit updates, based on information on a discharge amount of the imprint material discharged from each orifice, the distribution information such that a thickness of the imprint material formed using the mold falls within an allowable range.

8 Claims, 15 Drawing Sheets

(51) Int. Cl.
    *B41J 3/407* (2006.01)
    *B05B 1/30* (2006.01)
    *B05B 12/02* (2006.01)
    *B05D 3/12* (2006.01)
    *H01L 21/30* (2006.01)
    *H01L 21/033* (2006.01)
    *B29L 31/34* (2006.01)

(52) U.S. Cl.
    CPC ............ *B41J 3/407* (2013.01); *G03F 7/0002* (2013.01); *H01L 21/0337* (2013.01); *B05D 2203/30* (2013.01); *B29L 2031/34* (2013.01)

(56) References Cited

U.S. PATENT DOCUMENTS

| | | | |
|---|---|---|---|
| 8,440,253 B2 | 5/2013 | Hanaoka et al. | |
| 8,480,933 B2* | 7/2013 | Truskett | B82Y 10/00 264/40.1 |
| 9,389,513 B2* | 7/2016 | Koshiba | G06F 17/50 |
| 2010/0255746 A1* | 10/2010 | Hanaoka | G01B 11/00 445/24 |
| 2011/0189601 A1 | 8/2011 | Koshiba | |
| 2011/0309548 A1 | 12/2011 | Aihara | |
| 2012/0028378 A1 | 2/2012 | Morinaga et al. | |
| 2012/0131056 A1 | 5/2012 | Matsuoka et al. | |
| 2013/0113863 A1 | 5/2013 | Kodama et al. | |
| 2013/0241096 A1 | 9/2013 | Shudo et al. | |
| 2014/0037859 A1 | 2/2014 | Kobiki | |
| 2014/0065735 A1 | 3/2014 | Koshiba et al. | |
| 2014/0199472 A1 | 7/2014 | Kodama et al. | |

FOREIGN PATENT DOCUMENTS

| | | |
|---|---|---|
| JP | 2011159764 A | 8/2011 |
| JP | 2012004354 A | 1/2012 |
| JP | 2012011310 A | 1/2012 |
| JP | 201206687 A1 | 2/2012 |
| JP | 2012033769 A | 2/2012 |
| JP | 2012506635 A | 3/2012 |
| JP | 2012114157 A | 6/2012 |
| JP | 2013065624 A | 4/2013 |
| JP | 2013225661 A | 10/2013 |
| JP | 2014033069 A | 2/2014 |
| JP | 2014053333 A | 3/2014 |
| KR | 1020040098557 A | 11/2004 |
| KR | 1020100109850 A | 10/2010 |
| WO | 2013039259 A1 | 3/2013 |

OTHER PUBLICATIONS

International Search Report issued in Intl. Appln. No. PCT/JP2015/062315 dated Jul. 21, 2015.
Written Opinion issued in Intl. Appln. No. PCT/JP2015/062315 dated Jul. 21, 2015.
Office Action issued in Taiwanese Appln. No. 104113038 dated Jan. 4, 2016. English translation provided.
Office Action issued in Japanese Appln. No. 2014-095502 dated Aug. 25, 2017.
Office Action issued in Chinese Appln. No. 201580021792.3 dated Jun. 5, 2018. English translation provided.

* cited by examiner

IMPRINT APPARATUS, IMPRINT METHOD, AND METHOD OF MANUFACTURING ARTICLE

TECHNICAL FIELD

The present invention relates to an imprint apparatus, an imprint method, and a method of manufacturing an article.

BACKGROUND ART

An imprint apparatus which forms an imprint material on a substrate using a mold has received attention as one of lithography apparatuses for mass-producing semiconductor devices or the like. The imprint apparatus includes a plurality of orifices each of which discharges droplets of the imprint material toward the substrate. The imprint apparatus supplies the imprint material to the substrate by controlling discharge of the imprint material from each orifice in accordance with a map indicating the distribution of the imprint material that should be supplied onto the substrate.

In the imprint apparatus, an error may occur between a target amount and the discharge amount of the imprint material discharged from each orifice due to the manufacturing variation in the orifices or the like. In this case, the thickness of the imprint material after being formed using the mold may fall outside an allowable range. Japanese Patent Laid-Open No. 2013-65624 proposes an imprint apparatus capable of individually adjusting the discharge amount of an imprint material in each orifice of a plurality of orifices.

The imprint apparatus described in Japanese Patent Laid-Open No. 2013-65624 adjusts the discharge amount of the imprint material discharged from each orifice to a target amount by controlling the driving voltage of each orifice individually. However, this may complicate control of each orifice when supplying the imprint material onto a substrate.

SUMMARY OF INVENTION

The present invention provides an imprint apparatus advantageous in, for example, supplying an imprint material onto a substrate.

According to one aspect of the present invention, there is provided an imprint apparatus which forms a pattern in an imprint material supplied onto a substrate using a mold, the apparatus comprising: a supply unit including a plurality of orifices each of which discharges the imprint material toward the substrate and configured to supply the imprint material onto the substrate by discharge of the imprint material from each orifice; and a control unit configured to control the discharge of the imprint material from each orifice in accordance with distribution information indicating a distribution, on the substrate, of the imprint material that should be supplied onto the substrate, wherein the control unit updates, based on information on a discharge amount of the imprint material discharged from each orifice, the distribution information such that a thickness of the imprint material formed using the mold falls within an allowable range.

Further features of the present invention will become apparent from the following description of exemplary embodiments with reference to the attached drawings.

DESCRIPTION OF EMBODIMENTS

Figure 1:
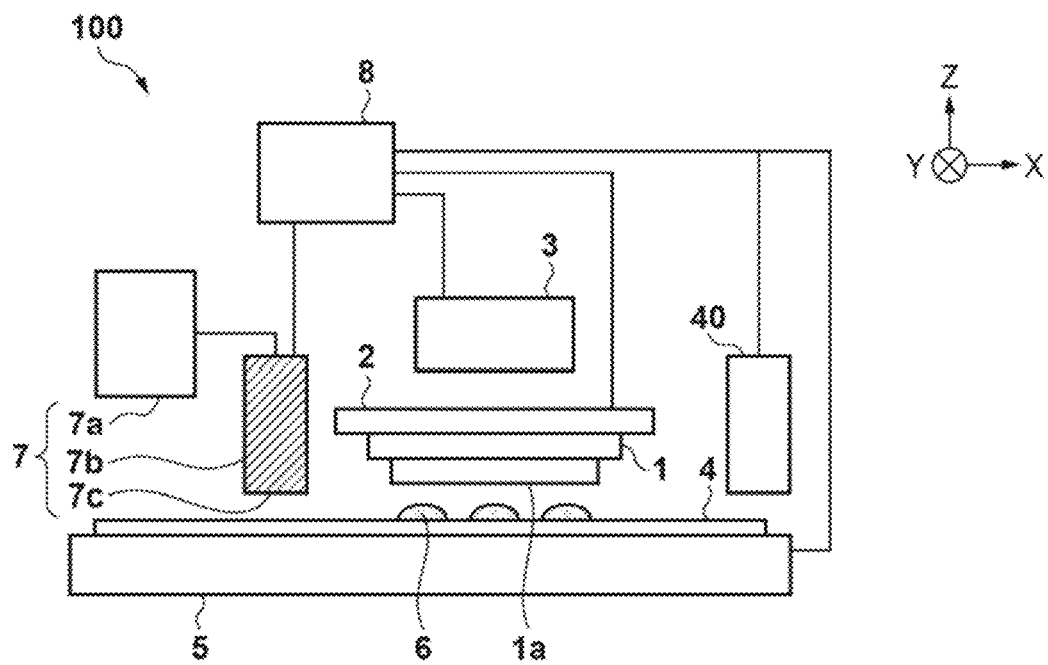
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described. The imprint apparatus 100 is used to manufacture a semiconductor device or the like and performs an imprint process of forming an imprint material 6 on a substrate using a mold 1. For example, the imprint apparatus 100 cures the imprint material 6 in a state in which the mold 1, on which a concave-convex pattern has been formed, is brought into contact with the imprint material 6 on the substrate. Then, the imprint apparatus 100 can form a pattern in the imprint material 6 on the substrate by widening the spacing between the mold 1 and a substrate 4, and separating (releasing) the mold 1 from the cured imprint material 6. A method of curing the imprint material 6 includes a heat cycle method using heat and a photo-curing method using light. In the first embodiment, an example in which the photo-curing method is adopted will be described. The photo-curing method is a method of curing the imprint material 6 by supplying an uncured ultraviolet-curing resin as the imprint material 6 onto the substrate, and irradiating the imprint material 6 with ultraviolet rays in a state in which the mold 1 and the imprint material 6 are in contact with each other. A case in which the ultraviolet rays are used as light will be described here. However, light having a different wavelength may be used depending on a photo-curing resin used as the imprint material.

[Configuration of Imprint Apparatus]

FIG. 1 is a schematic diagram showing the imprint apparatus 100 according to the first embodiment. The imprint apparatus 100 can include a mold stage 2 which holds the mold 1, a substrate stage 5 which holds the substrate 4, and a curing unit 3 which cures the imprint material 6 on the substrate by irradiating it with light. The imprint apparatus 100 can also include a supply unit 7 which supplies the imprint material 6 to the substrate 4 and a control unit 8. The control unit 8 includes, for example, a CPU and a memory, and controls the imprint process (controls the respective units of the imprint apparatus 100).

The mold 1 is normally made of a material such as quartz capable of transmitting ultraviolet rays. A concave-convex pattern for forming the imprint material 6 on the substrate is formed in a partial region (pattern region 1a) on a surface on the substrate side. As the substrate 4, for example, a single-crystal silicon substrate, an SOI (Silicon on Insulator) substrate, or a glass substrate can be used. The supply unit 7 to be described later supplies the imprint material 6 to the upper surface (processed surface) of the substrate 4.

The mold stage 2 holds the mold 1 by, for example, a vacuum suction force or an electrostatic force, and drives the mold 1 in a Z direction to bring the pattern region 1a of the mold 1 and the imprint material 6 on the substrate into contact with each other or separate them from each other. In addition to a function of driving the mold 1 in the Z direction, the mold stage 2 may have an adjustment function of adjusting the position of the mold 1 in X and Y directions and a θ direction (a rotation direction about a Z-axis), a tilt function of correcting the tilt of the mold 1, and the like. The substrate stage 5 holds the substrate 4 by, for example, a vacuum suction force or an electrostatic force, and aligns the substrate 4 in the X and Y directions. In addition to a function of moving the substrate 4 in the X and Y directions, the substrate stage 5 may have a function of moving the substrate 4 in the Z direction, an adjustment function of adjusting the position of the substrate 4 in the θ direction, and the like. In the imprint apparatus 100 according to the first embodiment, the mold stage 2 performs an operation of changing the distance between the mold 1 and the substrate 4. However, the present invention is not limited to this, and the substrate stage 5 may perform that operation or both of the mold stage 2 and the substrate stage 5 may relatively perform that operation.

The curing unit 3 cures the imprint material 6 supplied onto the substrate by irradiating it with light (ultraviolet rays) in the imprint process. The curing unit 3 includes, for example, a light source which emits light (ultraviolet rays) which cures the imprint material 6. The curing unit 3 may also include an optical element for adjusting the light emitted from the light source to light suitable for the imprint process. Since the first embodiment adopts the photo-curing method, the light source which emits ultraviolet rays is used. However, when the first embodiment adopts, for example, a thermosetting method, a heat source for setting a thermosetting resin serving as the imprint material 6 can be used instead of the light source.

The supply unit 7 can include a tank 7a which accommodates the imprint material 6 and a dispenser 7b which supplies the imprint material 6 accommodated in the tank 7a to the substrate. The dispenser 7b includes a plurality of nozzles 7c (orifices, discharge port) each of which discharges the droplets of the imprint material 6 toward the substrate 4. The supply unit 7 supplies the imprint material 6 onto the substrate by discharging the droplets of the imprint material 6 from each nozzle 7c in a state in which the substrate 4 and the supply unit 7 move relatively. When, for example, the plurality of nozzles 7c are arrayed in the Y direction, a step of supplying the droplets of the imprint material 6 from each nozzle 7c to the substrate 4 is performed in a state in which the substrate 4 moves in a direction (for example, the X direction) different from the arrayed direction of the plurality of nozzles 7c. At this time, the control unit 8 controls discharge or non-discharge of the imprint material from each nozzle 7c in accordance with information (distribution information) indicating the distribution of the imprint material 6 that should be supplied onto the substrate. In this embodiment, information (to be simply referred to as a map herein) indicating the arrangement on the substrate of the droplets of the imprint material 6 that should be supplied onto the substrate is regarded as the distribution information. The map including the information indicating the arrangement on the substrate of the droplets of the imprint material 6 is generated in advance based on the design information of the concave-convex pattern that has been formed in the pattern region 1a of the mold 1. The map can also be generated by the control unit 8 in the imprint apparatus 100.

[Method of Generating Map]

Figure 2:
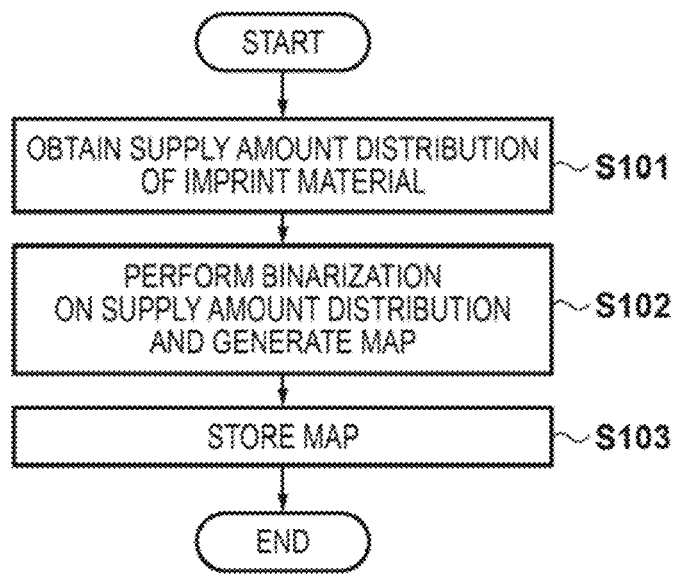
FIG. 2 is a flowchart showing a method of generating a map for controlling each nozzle.
Figure 3:
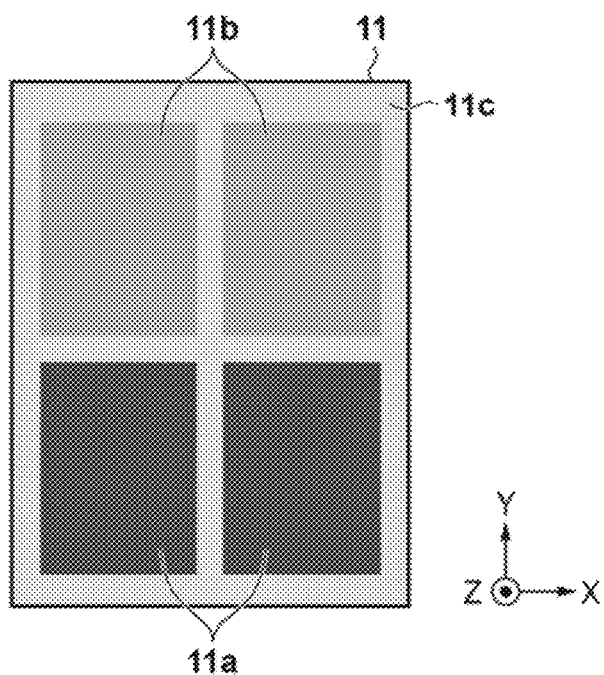
FIG. 3 is a view showing an example of a supply amount distribution obtained based on the design information of a pattern that has been formed on a mold.

A method of generating the map by the control unit 8 will now be described. FIG. 2 is a flowchart showing the method of generating the map for controlling discharge of the droplets of the imprint material 6 from each nozzle 7c. In step S101, the control unit 8 obtains a supply amount distribution 11 of the imprint material 6 necessary for the concave-convex pattern that has been formed on the mold 1 based on the design information of the pattern (information indicating the position of the pattern and the depth of a concave portion). For example, the control unit 8 obtains the supply amount distribution 11 such that the thickness of the imprint material 6 formed into the concave-convex pattern using the mold 1 falls within an allowable range, assuming that the discharge amount of the imprint material discharged as the droplets from each nozzle 7c is a target amount. The thickness of the imprint material 6 that has been formed is, for example, the thickness (film thickness) between the substrate 4 and each concave portion of the pattern formed by the imprint material 6. This thickness (film thickness) is generally referred to as a residual layer thickness (RLT). Instead of the residual layer thickness, the height of the pattern of the imprint material 6 formed on the substrate may be used. FIG. 3 is a view showing an example of the supply amount distribution 11 obtained based on the design information of the pattern that has been formed on the mold 1. In FIG. 3, the supply amount distribution 11 is represented with multi-value image data by color densities and a darker color indicates the larger supply amount of the imprint material 6. In the supply amount distribution 11 shown in FIG. 3, for example, each region 11b indicates a region which is supplied with a larger amount of the imprint material 6 than a region 11c because the depth of the concave-convex pattern is larger in the region 11b than in the region 11c. Similarly, each region 11a indicates a region which is supplied with a larger amount of the imprint material 6 than each region 11b because the depth of the concave-convex pattern is larger in the region 11a than in the region 11b.

Figure 4:
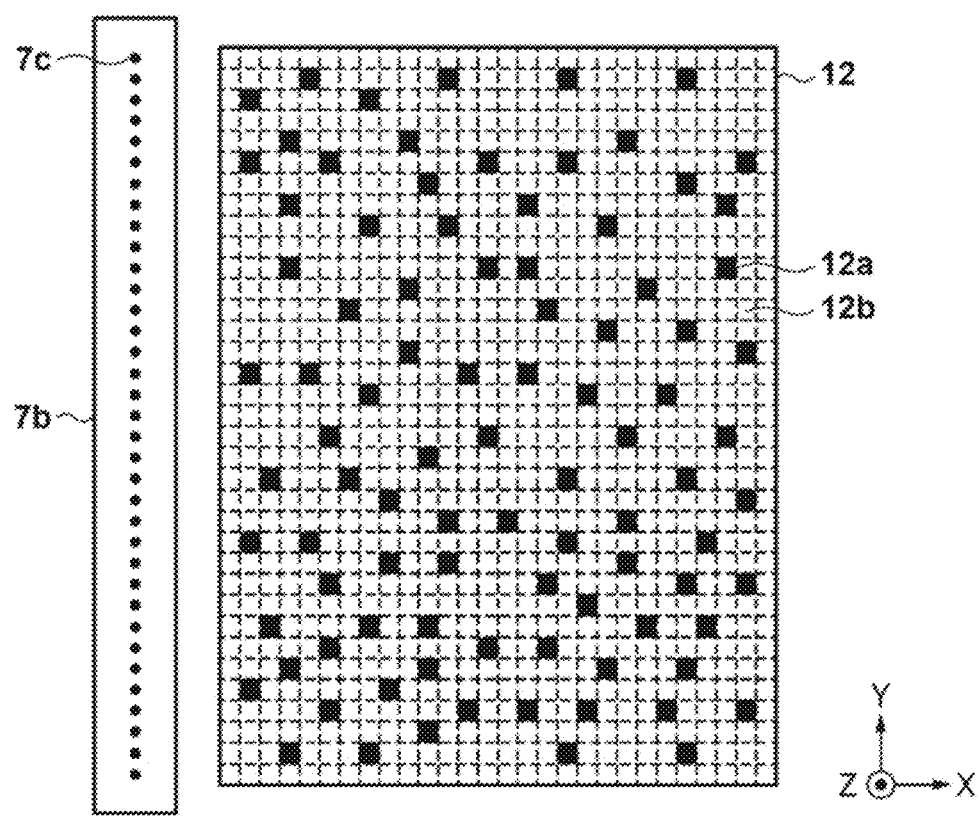
FIG. 4 is a view showing the correspondence relationship between the array of the plurality of nozzles and an example of the map generated based on the supply amount distribution.

In step S102, the control unit 8 performs binarization by halftone processing on the supply amount distribution 11 obtained in step S101 and generates a map indicating a position where the droplets of the imprint material 6 should be supplied. For example, an error diffusion method can be used as the halftone processing. FIG. 4 is a view showing the correspondence relationship between the array of the plurality of nozzles 7c in the dispenser 7b and an example of a map (map 12) generated based on the supply amount distribution 11. The map 12 shown in FIG. 4 shows the arrangement of the droplets of the imprint material 6 that should be supplied to one shot region (a region where the pattern of the mold 1 is to be transferred by one imprint process) on the substrate. The number of pixels in the Y direction equals the number of nozzles 7c. Further, in the map 12, each black pixel 12a indicates a position on a shot region where the droplets of the imprint material 6 are to be supplied and each white pixel 12b indicates a position on the shot region where the droplets of the imprint material 6 are not to be supplied. In step S103, the control unit 8 stores the map generated in step S102.

In accordance with the map generated as described above, the control unit 8 controls discharge of the droplets from each nozzle 7c while relatively moving the substrate 4 and the supply unit 7 in the X direction. This allows the thickness of the imprint material 6 formed into the concave-convex pattern using the mold 1 to fall within the allowable range over the entire shot region. In the imprint apparatus 100, however, an error may occur between a target amount and the discharge amount of the imprint material 6 discharged as the droplets from each nozzle 7c due to the manufacturing variation in the nozzles 7c or the like. For this reason, if discharge from each nozzle 7c is controlled using the map generated by the above-described method when the error occurs in the discharge amount from each nozzle 7c, a portion may occur where the thickness of the imprint material 6 formed using the mold falls outside the allowable range. To prevent this, the imprint apparatus 100 according to this embodiment updates the map based on information on the discharge amount of the imprint material 6 discharged as the droplets from each nozzle 7c such that the thickness of the imprint material 6 formed using the mold 1 falls within the allowable range. The imprint process in the imprint apparatus 100 according to the first embodiment will be described below. In the first embodiment, the volume of each droplet supplied from each nozzle 7c to the substrate 4 (including a dummy substrate) and cured by the curing unit 3 without being formed using the mold 1 is obtained as the information on the discharge amount of the imprint material 6 from each nozzle 7c.

[Imprint Process]

Figure 5:
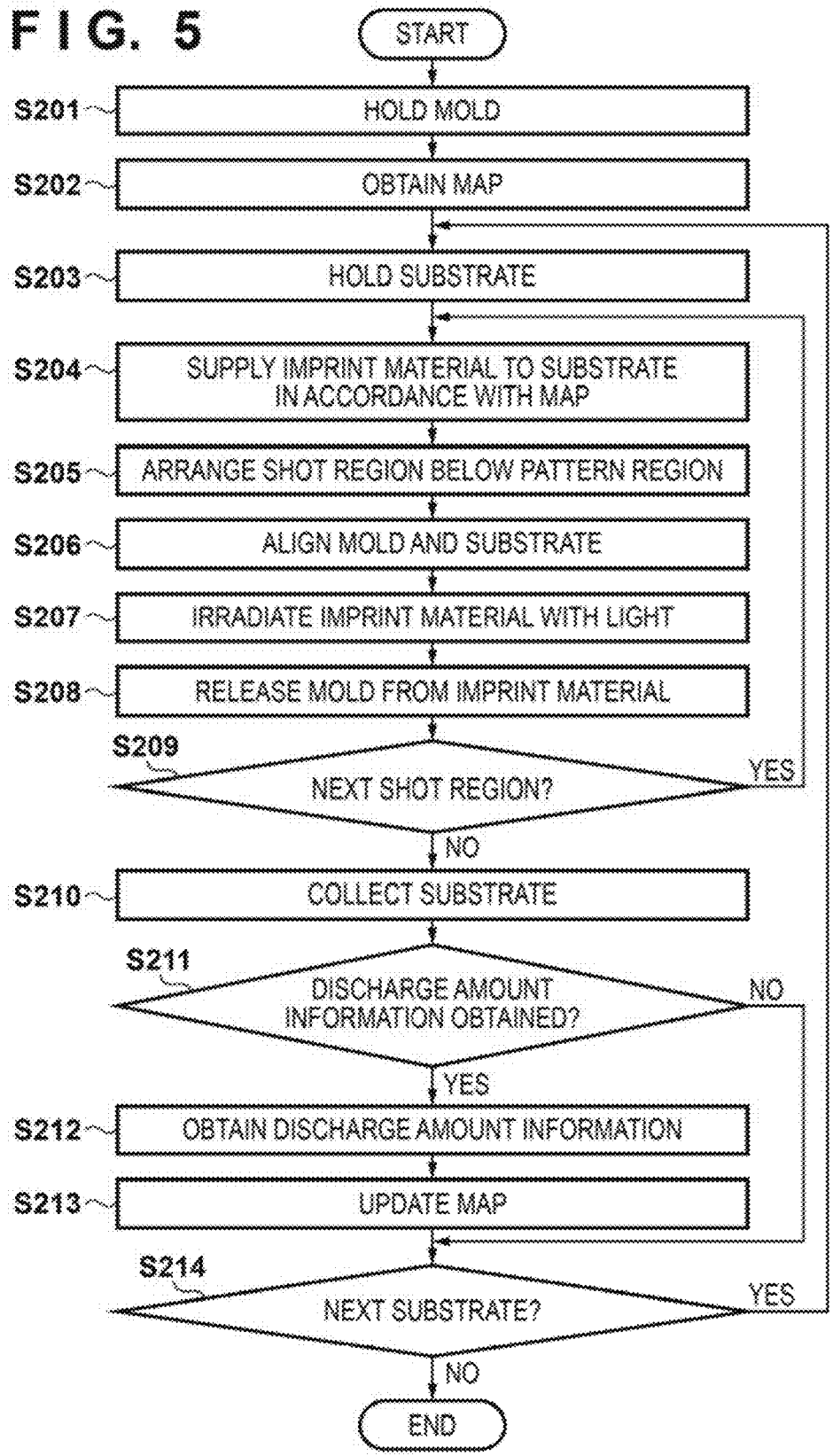
FIG. 5 is a flowchart showing an imprint process according to the first embodiment.

FIG. 5 is a flowchart showing the imprint process according to the first embodiment. In step S201, the control unit 8 controls a mold conveyance mechanism (not shown) to convey the mold 1 to a position below the mold stage 2 and controls the mold stage 2 to hold the mold 1. A concave-convex pattern according to the design information is formed on the mold 1 (pattern region 1a), as described above, and an individual ID for identifying the pattern formed on the mold 1 is set. The control unit 8 causes a reading mechanism (not shown) to read the individual ID of the mold 1, thereby obtaining the individual ID. In step S202, the control unit 8 obtains a map for controlling each of the plurality of nozzles 7b of the dispenser 7b based on the individual ID of the mold 1 obtained in step S201. The map may be generated in advance based on the design information of the concave-convex pattern formed on the mold 1 or may be sequentially generated by reading out the design information of the pattern from the individual ID. In step S203, the control unit 8 controls a substrate conveyance mechanism (not shown) to convey the substrate 4 to a position above the substrate stage 5 and controls the substrate stage 5 to hold the substrate 4. The substrate 4 is thus arranged within the imprint apparatus.

In step S204, the control unit 8 controls the supply unit 7 to supply the imprint material 6 to a target shot region to which the pattern of the mold 1 is to be transferred. For example, the control unit 8 controls discharge of droplets from each nozzle 7c according to the map obtained in step S203 while moving the substrate 4 in the X direction. In step S205, the control unit 8 controls the substrate stage 5 to arrange, below the pattern region 1a of the mold 1, the shot region to which the imprint material 6 has been supplied. The control unit 8 controls the mold stage 2 to bring the mold 1 and the imprint material 6 on the substrate into contact with each other, that is, to decrease the distance between the mold 1 and the substrate 4. In step S206, the control unit 8 aligns the mold 1 and the substrate 4 in the state in which the mold 1 and the imprint material 6 are in contact with each other. For example, the control unit 8 causes an alignment scope (not shown) to detect a mark provided on the mold 1 and a mark provided on the substrate 4, and controls the relative positions of the mold 1 and the substrate 4 using the detected marks of the mold 1 and the substrate 4. Note that in steps S205 and S206, a predetermined time may elapse in the state in which the mold 1 and the imprint material 6 are in contact with each other in order to sufficiently fill the concave portions of the pattern of the mold 1 with the imprint material 6 on the substrate.

In step S207, the control unit 8 controls the curing unit 3 to irradiate, with light (ultraviolet rays), the imprint material 6 which is in contact with the mold 1, thereby curing the imprint material 6. In step S208, the control unit 8 controls the mold stage 2 to separate (release) the mold 1 from the imprint material 6, that is, to increase the distance between the mold 1 and the substrate 4. In step S209, the control unit 8 determines whether there is a shot region (next shot region) to which the pattern of the mold 1 is to be continuously transferred onto the substrate. If there is the next shot region, the process advances to step S204. If there is no next shot region, the process advances to step S210. In step S210, the control unit 8 controls the substrate conveyance mechanism (not shown) to collect the substrate 4 from the substrate stage 5. In step S211, the control unit 8 determines whether to obtain information on the discharge amount (to be referred to as discharge amount information hereinafter) of the imprint material 6 discharged as the droplets from each nozzle 7c. If the control unit 8 determines to obtain the discharge amount information, the process advances to step S212. If the control unit 8 determines not to obtain the discharge amount information, the process advances to step S214. Determination of whether to obtain the discharge amount information from each nozzle 7c can be made based on a condition such as the number of substrates 4 or shot regions to which the pattern of the mold 1 has been transferred, or an elapsed time since the discharge amount information was obtained before. In step S212, the control unit 8 obtains the discharge amount information. In step S213, the control unit 8 updates the map based on the discharge amount information obtained in step S212 such that the thickness of the imprint material 6 formed using the mold 1 falls within the allowable range. For example, the control unit 8 updates the map based on the discharge amount information by changing at least one of the number and the positions of droplets in the map. In step S214, the control unit 8 determines whether there is the substrate 4 (next substrate 4) where transfer of the pattern of the mold 1 is to be performed continuously. If there is the next substrate 4, the process advances to step S203. If there is no next substrate, the imprint process ends.

[Discharge Amount Information Obtainment]

Figure 6:
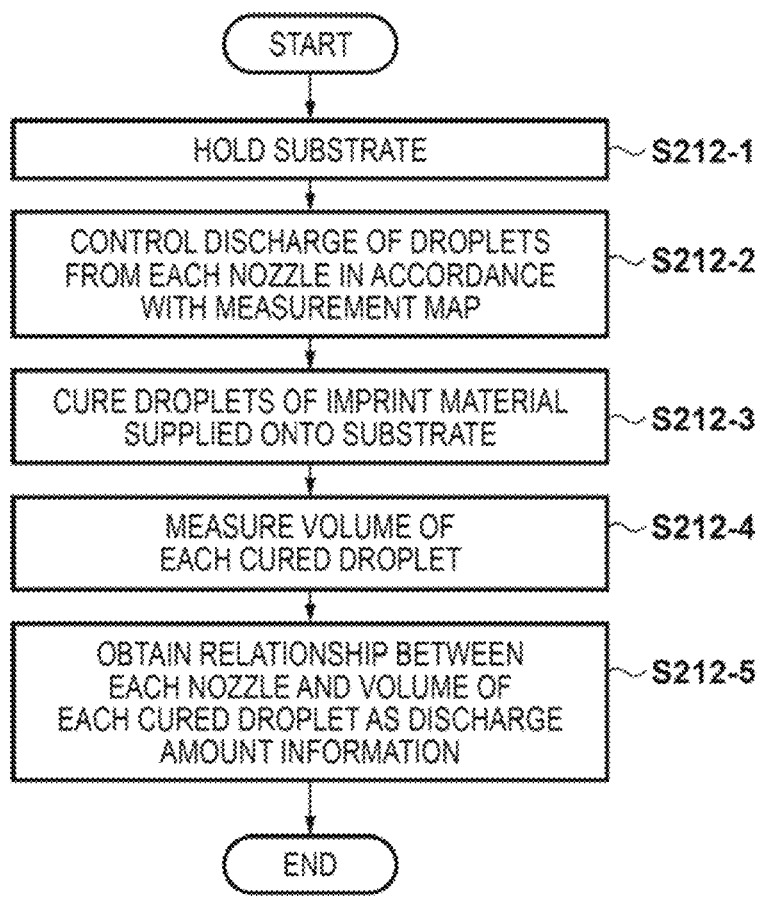
FIG. 6 is a flowchart of discharge amount information obtainment according to the first embodiment.

Discharge amount information obtainment performed in step S212 will now be described with reference to FIG. 6. FIG. 6 is a flowchart of discharge amount information obtainment. In the first embodiment, the volume of each droplet of the imprint material 6 supplied from each nozzle 7c to the substrate 4 (including the dummy substrate) and cured by the curing unit 3 without being formed using the mold 1 is obtained as the discharge amount information.

Figure 7:
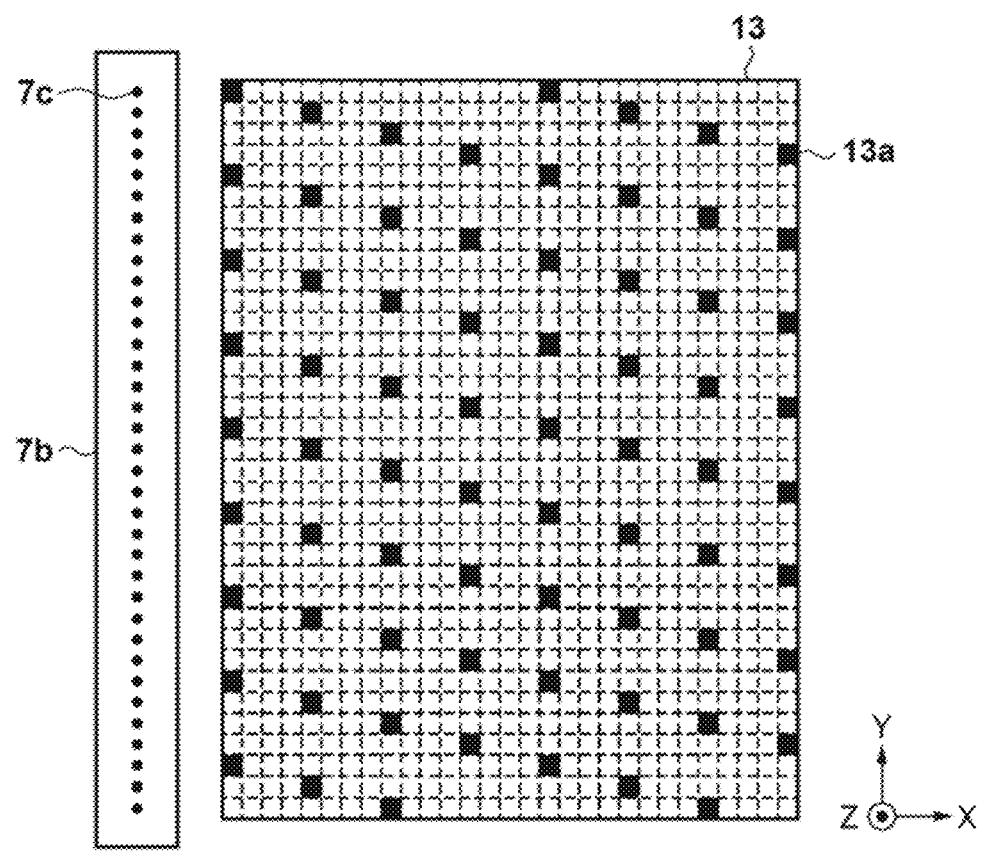
FIG. 7 is a view showing the correspondence relationship between the array of the plurality of nozzles and a measurement map 13.
Figure 8A:
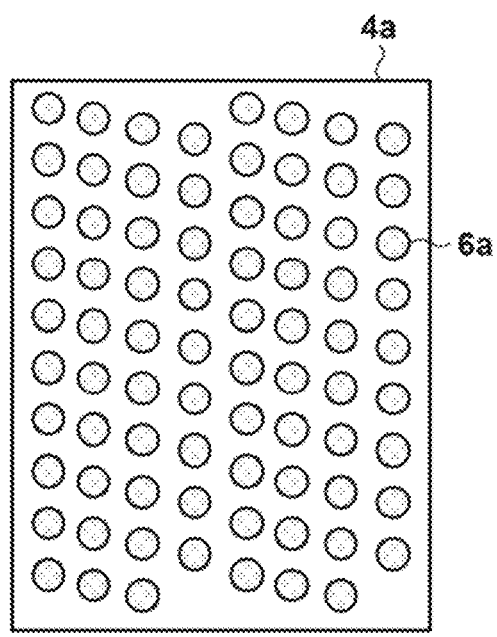
FIG. 8A is a view for explaining discharge amount information obtainment according to the first embodiment.

In step S212-1, the control unit 8 controls the substrate conveyance mechanism (not shown) to convey the substrate 4 (for example, the dummy substrate) onto the substrate stage 5 and controls the substrate stage 5 to hold the substrate 4. In step S212-2, the control unit 8 controls discharge of the droplets from each nozzle 7c in accordance with a measurement map 13 while moving the substrate 4 in the X direction. The measurement map 13 is a map indicating the arrangement of the droplets of the imprint material 6 supplied from each nozzle 7c to the substrate 4 to obtain the discharge amount information. In the measurement map 13, for example, as shown in FIG. 7, the black pixels 13a each indicating a position where the droplets are supplied can be set at a distance between them so as not to bring the droplets of the imprint material 6 discharged from each nozzle 7c into contact with each other. FIG. 7 is a view showing the correspondence relationship between the measurement map 13 and the array of the plurality of nozzles 7c in the dispenser 7b. In step S212-3, the control unit 8 controls the substrate stage 5 to arrange, below the curing unit 3, a region 4a on the substrate to which the imprint material 6 has been supplied in accordance with the measurement map 13. Then, the control unit 8 controls the curing unit 3 to irradiate the imprint material 6 on the substrate with light (ultraviolet rays) without bringing the mold 1 and the imprint material 6 into contact with each other, that is, without forming the imprint material 6 using the mold 1. This makes it possible, as shown in FIG. 8A, to cure the droplets of the imprint material 6 that has been supplied to the region 4a on the substrate. FIG. 8A is a view showing the arrangement on the region 4a of the droplets of the imprint material 6 that has been cured on the substrate by irradiation with light (to be referred to as cured droplets 6a hereinafter).

Figure 9A:
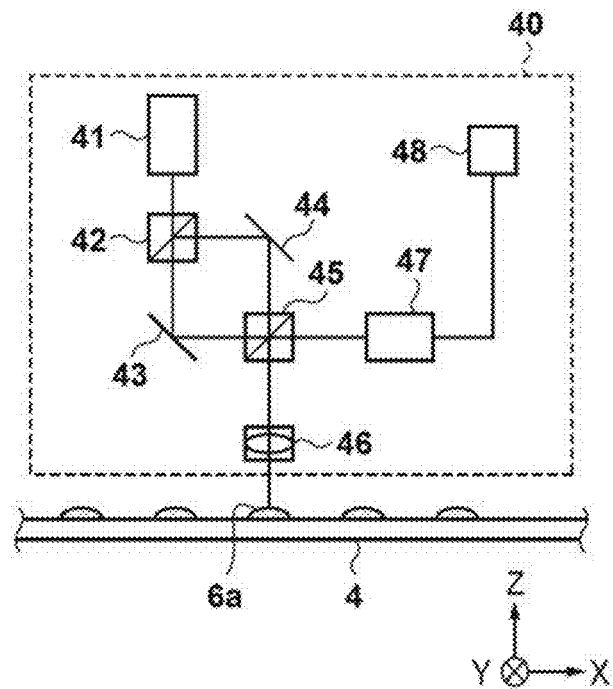
FIG. 9A is a view showing the configuration of a measurement unit.
Figure 9B:
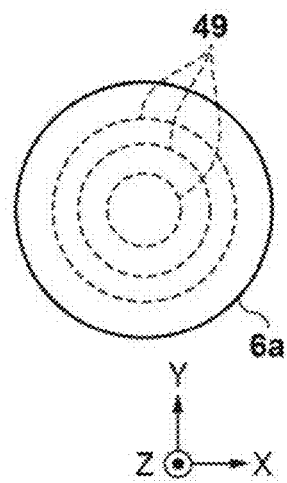
FIG. 9B is a view showing interference fringes which occur in cured droplets.
Figure 9C:
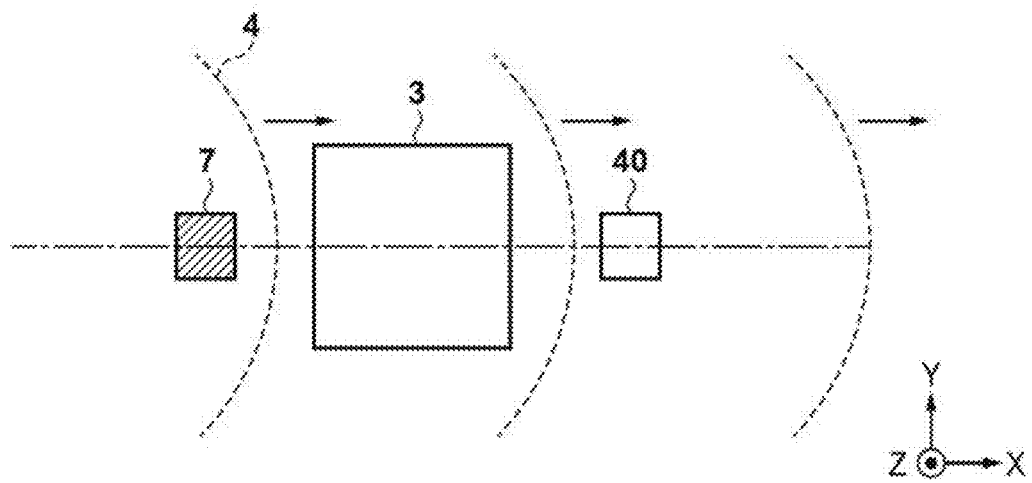
FIG. 9C is a view showing the arrangement of a measurement unit.

In step S212-4, the control unit 8 causes a measurement unit 40 to measure the volume of each cured droplet 6a cured in step S212-3. As shown in FIG. 1, the imprint apparatus 100 according to the first embodiment can include the measurement unit 40 which measures the volume of each cured droplet 6a. FIGS. 9A, 9B, and 9C are views showing the configuration and arrangement of the measurement unit 40. For example, as shown in FIG. 9A, the measurement unit 40 can include a light source 41, beam splitters 42 and 45, mirrors 43 and 44, an objective lens 46, an image sensor 47, and a processor 48. The beam splitter 42 divides a laser beam emitted from the light source 41 into transmitted light and reflected light. The transmitted light that has transmitted through the beam splitter 42 is reflected by the mirror 43 to be incident on the beam splitter 45. The light which has transmitted through the beam splitter 45 is directed to the image sensor 47 as reference light. On the other hand, the reflected light reflected by the beam splitter 42 is reflected by the mirror 44 to be incident on the beam splitter 45. The cured droplets 6a on the substrate are irradiated with the reflected light via the beam splitter 45 and the objective lens 46. Light reflected by the cured droplets 6a passes through the objective lens 46 again to be incident on the beam splitter 45. The light reflected by the beam splitter 45 is directed to the image sensor 47 as test light. The image sensor 47 includes, for example, a CMOS sensor or a CCD sensor and captures the cured droplets 6a. The processor 48 obtains the image of each cured droplet 6a captured by the image sensor 47. As shown in FIG. 9B, interference fringes 49 are generated by the optical path length difference between the reference light and measurement light in the image of each cured droplet 6a. Therefore, the processor 48 can obtain the surface shape of each cured droplet 6a based on the interference fringes 49 generated in the cured droplet 6a and calculate the volume of the cured droplet 6a from the obtained shape.

Figure 8B:
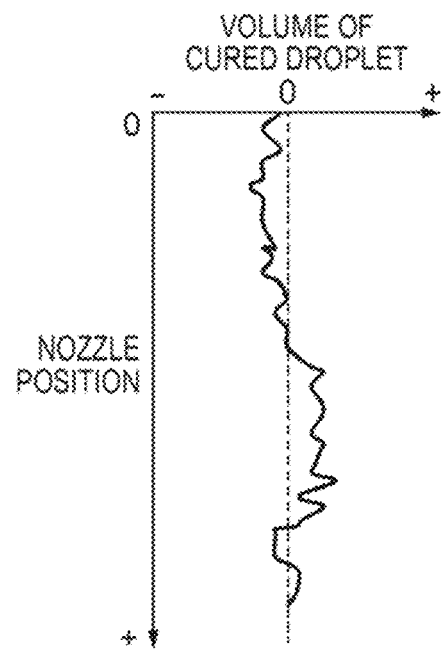
FIG. 8B is a view for explaining the discharge amount information obtainment according to the first embodiment.

In step S212-5, the control unit 8 obtains, from the measurement unit 40, the volume of each of the plurality of cured droplets 6a on the substrate (on the region 4a). Then, the control unit 8 can obtain the relationship between each nozzle 7c and the volume of each cured droplet 6a as the discharge amount information, as shown in FIG. 8B. FIG. 8B is a view showing the relationship between each nozzle 7c and the volume of each cured droplet 6a. In FIG. 8B, the abscissa represents the position of each nozzle 7c in the Y direction, while the ordinate represents an error from a target value in the volume of each cured droplet 6a.

Note that when measuring the volume of each cured droplet 6a, it is desirable to prevent the droplets of the imprint material 6 before being supplied onto the substrate and cured from spreading out on the substrate. That is, a time period from when the droplets of the imprint material 6 are supplied onto the substrate till the droplets are cured may be as short as, for example, 0.1 to 0.2 sec. Therefore, discharge of the droplets of the imprint material 6 from each nozzle 7c, curing of the droplets, and measurement of the volume of each cured droplet 6a may be performed successively while moving the substrate 4. To perform these, for example, as shown in FIG. 9C, the supply unit 7, the curing unit 3, and the measurement unit 40 may be arrayed in a moving direction of the substrate 4, that is, the curing unit 3 may be arranged between the supply unit 7 and the measurement unit 40. FIG. 9C is a view showing the arrangement of the supply unit 7, the curing unit 3, and the measurement unit 40 in the X and Y directions. Further, the first embodiment has described the example in which the measurement unit 40 provided within the imprint apparatus 100 measures the volume of each cured droplet 6a. However, the present invention is not limited to this. For example, a measurement apparatus provided outside the imprint apparatus 100 may measure the volume of each cured droplet 6a.

[Map Update]

Figure 10:
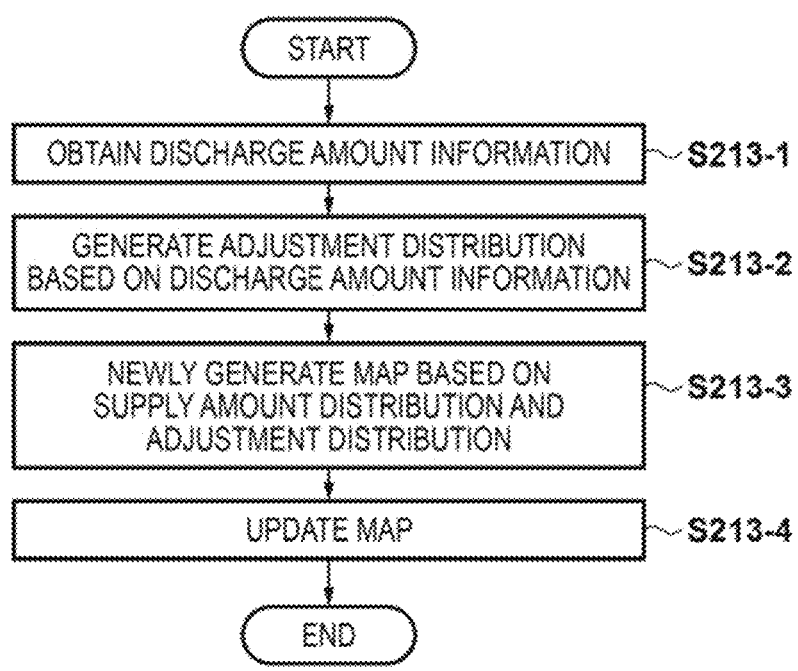
FIG. 10 is a flowchart of a map update according to the first embodiment.
Figure 11:
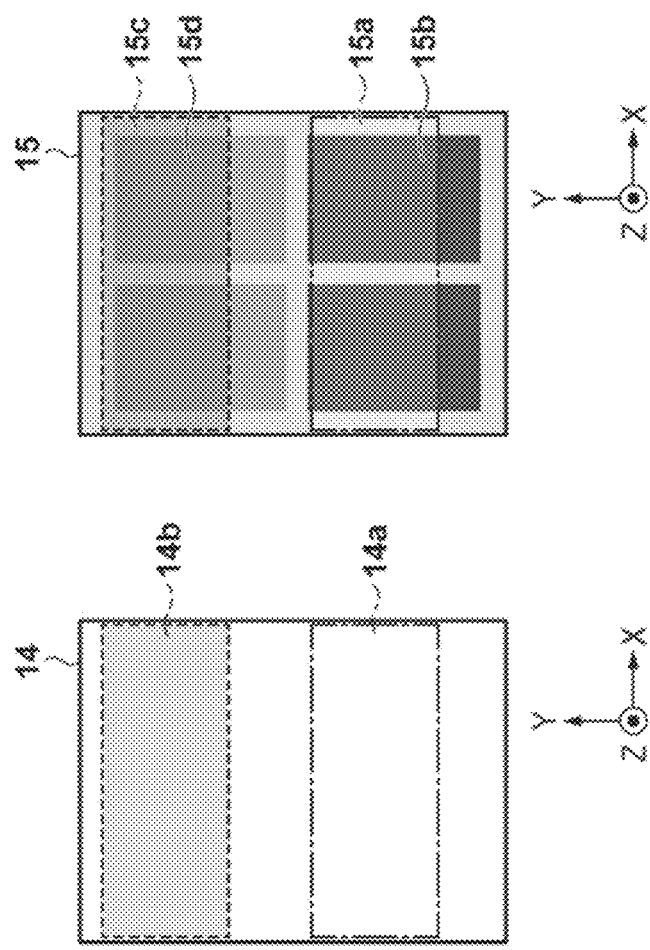
FIG. 11A is a view for explaining the map update according to the first embodiment.
FIG. 11B is a view for explaining the map update according to the first embodiment.
FIG. 11C is a view for explaining the map update according to the first embodiment.

The map update performed in step S213 will now be described. FIG. 10 is a flowchart of the map update. In step S213-1, the control unit 8 obtains discharge amount information (the relationship between each nozzle 7c and the volume of each cured droplet 6a). The control unit 8 performs, for example, a process of removing a high-frequency component from the discharge amount information shown in FIG. 8B. This allows the control unit 8 to obtain discharge amount information shown in FIG. 11A. In the discharge amount information shown in FIG. 11A, the discharge amount of the imprint material 6 discharged as the droplets from each nozzle 7c exceeds a target amount in the range 13a, while it falls below the target amount in a range 13b. In step S213-2, the control unit 8 generates a distribution (adjustment distribution 14) for adjusting the supply amount of the imprint material 6 based on the discharge amount information obtained in step S213-1. FIG. 11B is a view representing the adjustment distribution 14 with multi-value image data by color densities. In the adjustment distribution 14 shown in FIG. 11B, a region 14a corresponding to the range 13a of the discharge amount information shown in FIG. 11A is a region where, for example, the supply amount of the imprint material 6 is decreased by 5%. On the other hand, a region 14b corresponding to the range 13b of the discharge amount information is a portion where the supply amount of the imprint material 6 is increased by 10%. Adjustment of (increase/decrease in) the supply amount of the imprint material 6 is not performed in a region other than the regions 14a and 14b.

Figure 12:
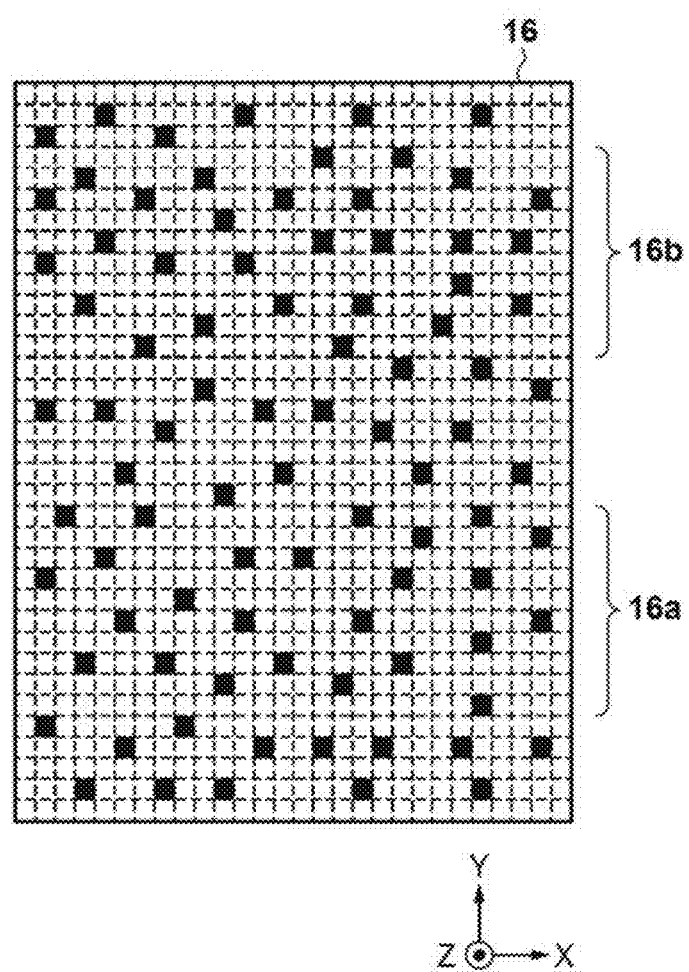
FIG. 12 is a view showing an example of a newly generated map according to the first embodiment.

In step S213-3, the control unit 8 newly generates a map indicating the arrangement of the droplets of the imprint material 6 that should be supplied onto the substrate based on the supply amount distribution 11 generated from the design information of the pattern of the mold 1 and the adjustment distribution 14 generated in step S213-2. FIG. 11C shows the image data of a distribution 15 obtained by overlaying the adjustment distribution 14 on the supply amount distribution 11 obtained based on the design information of the pattern of the mold 1. In the distribution 15 shown in FIG. 11C, regions 15a and 15b are portions where the supply amount of the imprint material 6 is decreased by 5%, while regions 15c and 15d are portions where the supply amount of the imprint material 6 is increased by 10%. The control unit 8 performs binarization by halftone processing on the distribution 15 shown in FIG. 11C and newly generates a map indicating a position where the droplets of the imprint material 6 should be supplied. FIG. 12 is a view showing an example of a newly generated map (map 16). In the newly generated map 16, the arrangement of the droplets of the imprint material 6 that should be supplied to the shot region on the substrate is changed from that in the map 12 generated from the design information of the pattern of the mold 1. In a region 16a in the newly generated map 16, the number of black pixels indicating the position where the droplets of the imprint material 6 are supplied is decreased as compared with the map 12 shown in FIG. 4 so as to correspond to the range 13a of the discharge amount information shown in FIG. 11A. On the other hand, in a region 16b, the number of black pixels indicating the position where the droplets of the imprint material 6 are supplied is increased as compared with the map 12 shown in FIG. 4 so as to correspond to the range 13b of the discharge amount information shown in FIG. 11A. In step S213-4, the control unit 8 stores the map 16 newly generated in step S213-3 and updates the map. A case in which the information indicating the arrangement of the droplets of the imprint material 6 supplied onto the substrate is updated has been described here. However, information indicating the density of the imprint material 6 supplied onto the substrate may be used in place of the information indicating the arrangement of the droplets.

As described above, the imprint apparatus 100 according to the first embodiment obtains, as the discharge amount information, the volume of each droplet of the imprint material 6 supplied from each nozzle 7c to the substrate 4 and cured without being formed using the mold 1. Then, the imprint apparatus 100 updates, based on the obtained discharge amount information, the map indicating the arrangement of the droplets of the imprint material 6 that should be supplied onto the substrate. This makes it possible to correct the error in the discharge amount of the imprint material 6 discharged as the droplets from each nozzle 7c by the map update and make the thickness of the imprint material 6 formed using the mold 1 fall within the allowable range.

Second Embodiment

An imprint apparatus according to the second embodiment of the present invention will be described. The imprint apparatus according to the second embodiment obtains, as discharge amount information, the thickness distribution (film thickness distribution) of an imprint material 6 which is supplied to a substrate 4 in accordance with a map 12 before an update and formed using a mold 1. In the imprint apparatus according to the second embodiment, although an imprint process is performed in accordance with a flowchart shown in FIG. 5, discharge amount information obtainment and a map update are different from those in the imprint apparatus 100 according to the first embodiment. Discharge amount information obtainment and the map update in the imprint apparatus according to the second imprint apparatus will be described below. The imprint apparatus according to the second embodiment has the same apparatus configuration as the imprint apparatus 100 according to the first embodiment, and thus a description thereof will be omitted.

[Discharge Amount Information Obtainment]

Figure 13A:
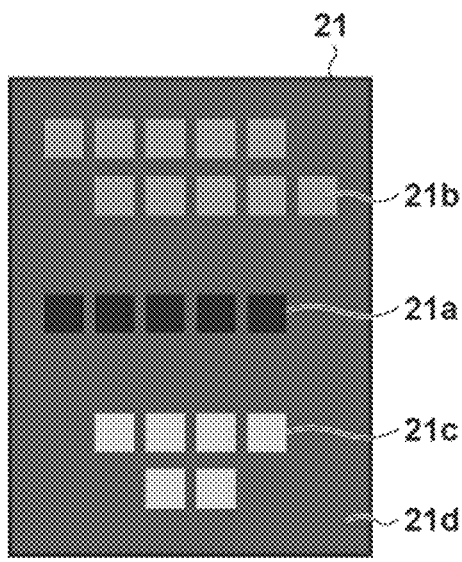
FIG. 13A is a view for explaining discharge amount information obtainment according to the second embodiment.
Figure 13B:
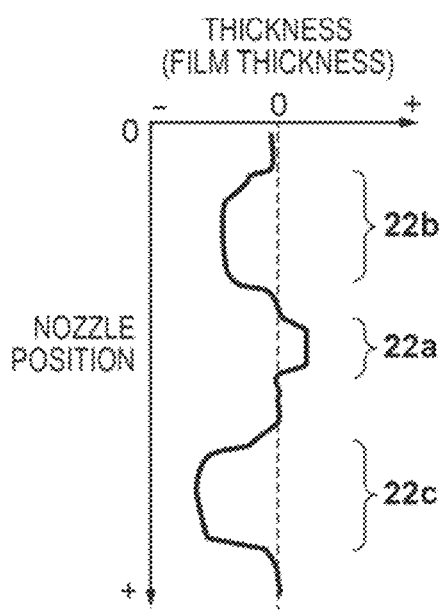
FIG. 13B is a view for explaining discharge amount information obtainment according to the second embodiment.

Discharge amount information obtainment (step S212) performed in the imprint apparatus according to the second embodiment will be described. In step S212, a control unit 8 obtains, as the discharge amount information, the thickness (film thickness) distribution of the imprint material 6 formed using the mold 1. The thickness (film thickness) distribution can be obtained by, for example, using the substrate 4 where steps (steps S201 to S110) of forming the imprint material 6 on the substrate using the mold 1 are performed to measure the thickness (film thickness) of the imprint material 6 in a plurality of portions of the substrate 4 (shot region). The thickness (film thickness) of the imprint material 6 is, for example, the thickness (film thickness) between the substrate 4 and the concave portion of a pattern formed by the imprint material 6, and can be measured by a measurement unit 40 provided within the imprint apparatus, a measurement apparatus provided outside the imprint apparatus, or the like. FIG. 13A is a view indicating the thickness (film thickness) of the imprint material 6 in each portion on the substrate (on the shot region). In FIG. 13A, the thickness (film thickness) of the imprint material 6 in each portion is represented with multi-value image data by color densities. For example, assuming that a portion 21d in FIG. 13A is the target value of the thickness (film thickness) of the imprint material 6, each portion 21a indicates a portion where the thickness of the imprint material 6 is larger than the target value, and each of portions 21b and 21c indicates a portion where the thickness of the imprint material 6 is smaller than the target value. Then, as shown in FIG. 13B, the control unit 8 obtains the thickness (film thickness) distribution of the imprint material 6 in the arrayed direction (Y direction) of a plurality of nozzles 7c based on the thickness (film thickness) of the imprint material 6 in each portion shown in FIG. 13A. In FIG. 13B, the abscissa represents the position of each nozzle 7c in the Y direction, while the ordinate represents an error from the target value in the thickness (film thickness) of the imprint material 6. Note that the thickness (film thickness) of the imprint material 6 in the thickness (film thickness) distribution may be the average value of the thicknesses (film thicknesses) of the imprint material 6 in a direction perpendicular to the arrayed direction of the plurality of nozzles 7c.

[Map Update]

Figure 13C:
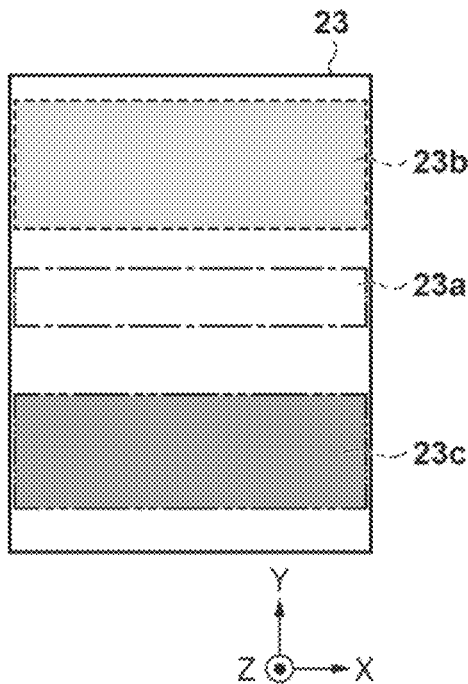
FIG. 13C is a view for explaining discharge amount information obtainment according to the second embodiment.

The map update (step S213) performed in the imprint apparatus according to the second embodiment will be described. In the imprint apparatus according to the second embodiment, the map update is performed in accordance with a flowchart shown in FIG. 10. In step S213-1, the control unit 8 obtains the thickness (film thickness) distribution shown in FIG. 13B as the discharge amount information. In the discharge amount information shown in FIG. 13B, the discharge amount of the imprint material 6 discharged as droplets from each nozzle 7c is larger than a target amount in a range 22a, while it is smaller than the target amount in ranges 22b and 22c. In step S213-2, the control unit 8 generates a distribution (adjustment distribution 23) for adjusting the supply amount of the imprint material 6 based on the discharge amount information obtained in step S213-2. FIG. 13C is a view showing the adjustment distribution 23 with the multi-value image data by color densities. In the adjustment distribution 23 shown in FIG. 13C, a region 23a corresponding to the range 22a of the discharge amount information shown in FIG. 13B is a region where, for example, the supply amount of the imprint material 6 is decreased by 5%. On the other hand, a region 23b corresponding to the range 22b of the discharge amount information is a region where, for example, the supply amount of the imprint material 6 is increased by 5% and a region 23c corresponding to the range 22c of the discharge amount information is a region where, for example, the supply amount of the imprint material 6 is increased by 15%. Adjustment of (increase/decrease in) the supply amount of the imprint material 6 is not performed in a region other than the regions 23a to 23c.

Figure 13D:
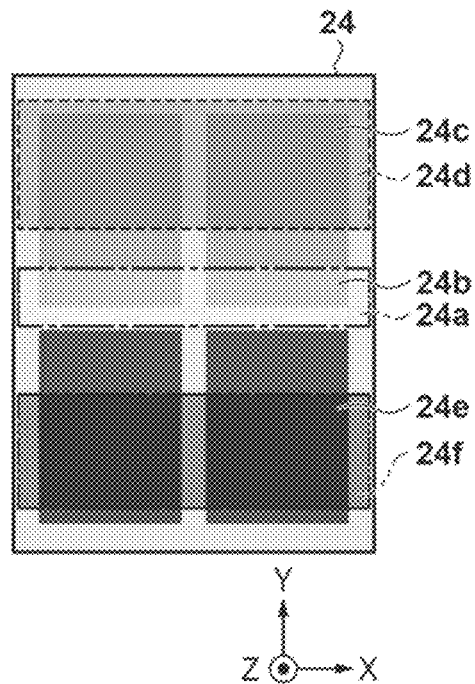
FIG. 13D is a view for explaining discharge amount information obtainment according to the second embodiment.
Figure 14:
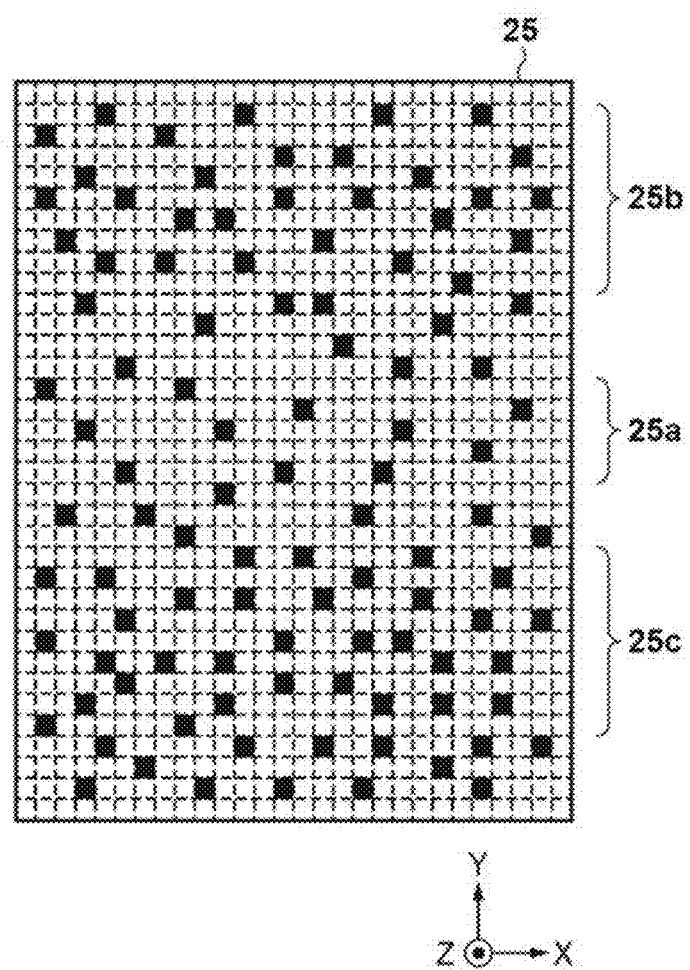
FIG. 14 is a view showing an example of a newly generated map according to the second embodiment.

In step S213-3, the control unit 8 newly generates a map indicating the arrangement of the droplets of the imprint material 6 that should be supplied onto the substrate based on a supply amount distribution 11 generated from the design information of the pattern of the mold 1 and the adjustment distribution 23 generated in step S213-2. FIG. 13D shows the image data of a distribution 24 obtained by overlaying the adjustment distribution 23 on the supply amount distribution 11 obtained based on the design information of the pattern of the mold 1. In the distribution 24 shown in FIG. 13D, regions 24a and 24b are regions where the supply amount of the imprint material 6 is decreased by 5%. On the other hand, regions 24c and 24d are regions where the supply amount of the imprint material 6 is increased by 5%, and regions 24e and 24f are regions where the supply amount of the imprint material 6 is increased by 15%. The control unit 8 performs binarization by halftone processing on the distribution 24 shown in FIG. 13D and newly generates a map indicating a position where the droplets of the imprint material 6 should be supplied. FIG. 14 is a view showing an example of a newly generated map (map 25). In the newly generated map 25, the arrangement of the droplets of the imprint material 6 that should be supplied to the shot region on the substrate is changed from that in the map 12 generated from the design information of the pattern of the mold 1. In a region 25a in the newly generated map 25, the number of black pixels indicating the position where the droplets of the imprint material 6 are supplied is decreased as compared with the map 12 shown in FIG. 4 so as to correspond to the range 22a of the discharge amount information shown in FIG. 13B. On the other hand, in regions 25b and 25c, the number of black pixels indicating the position where the droplets of the imprint material 6 are supplied is increased as compared with the map 12 shown in FIG. 4 so as to correspond to the ranges 22b and 22c of the discharge amount information shown in FIG. 13B. In step S213-4, the control unit 8 stores the map 25 newly generated in step S213-3 and updates the map.

As described above, the imprint apparatus according to the second embodiment obtains the thickness (film thickness) distribution of the imprint material formed using the mold 1 as the discharge amount information and updates, based on the obtained discharge amount information, the map indicating the arrangement of the droplets of the imprint material 6 that should be supplied onto the substrate. This makes it possible to correct the error in the discharge amount of the imprint material 6 discharged as the droplets from each nozzle 7c by the map update and make the thickness of the imprint material 6 formed using the mold 1 fall within an allowable range.

Third Embodiment

An imprint apparatus according to the third embodiment of the present invention will be described. The imprint apparatus according to the third embodiment obtains information (lost information) on the difference (loss) between the target pattern and a pattern formed by an imprint material 6 supplied to a substrate 4 in accordance with a map 12 before an update and formed using a mold 1. Note that the target pattern includes a pattern obtained based on the design information of the pattern (concave-convex shape) of the mold 1 and formed in (transferred to) the imprint material 6 on the substrate. Then, the imprint apparatus according to the third embodiment updates, based on the obtained lost information, a map indicating the arrangement of the droplets of the imprint material 6 that should be supplied onto the substrate. Note that the loss in the pattern formed by the imprint material 6 can include a loss (unfilling loss) or the like generated when, for example, the concave portion of the pattern of the mold 1 is not filled with the imprint material 6 sufficiently. The imprint apparatus according to the third embodiment has the same apparatus configuration as the imprint apparatus 100 according to the first embodiment, and thus a description thereof will be omitted.

Figure 15:
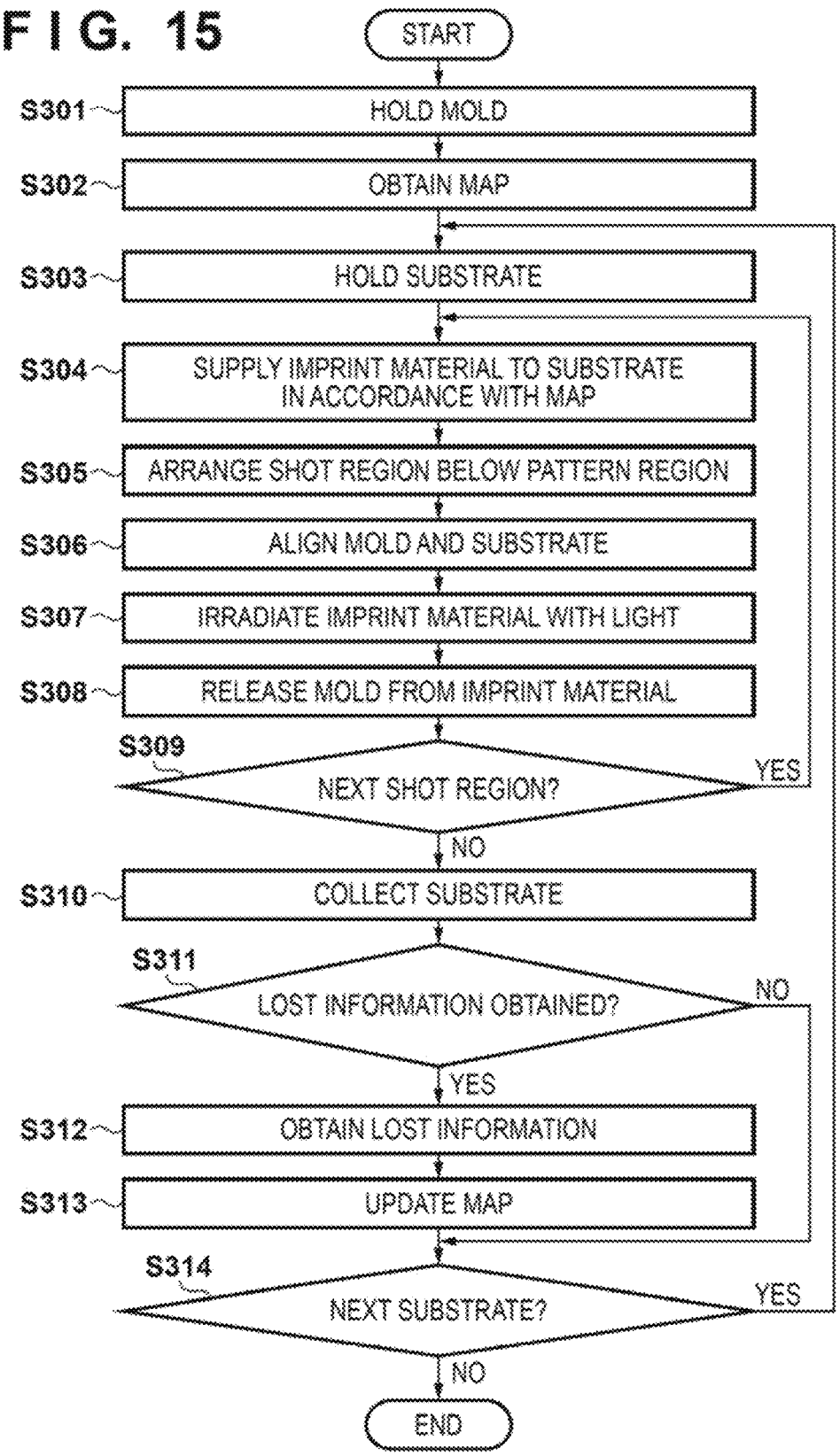
FIG. 15 is a flowchart showing an imprint process according to the third embodiment.
Figure 16:
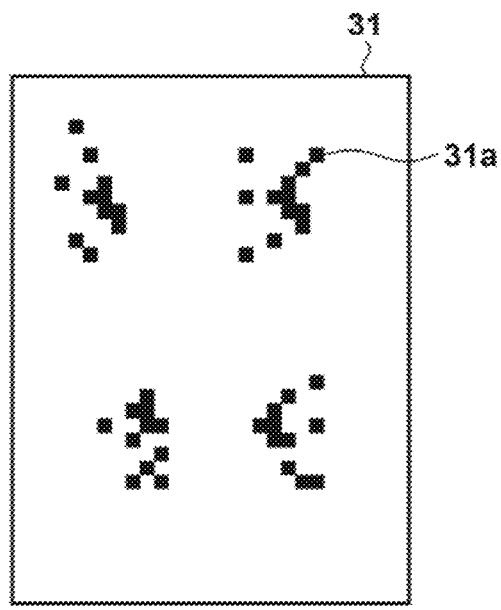
FIG. 16 is a view showing lost information in a pattern of an imprint material.

FIG. 15 is a flowchart showing an imprint process according to the third embodiment. Steps S301 to S310 of the flowchart in FIG. 15 are the same as steps S201 to S210 of the flowchart in FIG. 5, and thus a description thereof will be omitted. In step S311, a control unit 8 determines whether to obtain the lost information. If the control unit 8 determines to obtain the lost information, the process advances to step S312. If the control unit 8 determines not to obtain the lost information, the process advances to step S314. Determination of whether to obtain the lost information can be made based on a condition such as the number of substrates 4 or shot regions to which the pattern of the mold has been transferred, or an elapsed time since the lost information was obtained before. In step S312, the control unit 8 obtains the lost information in a pattern formed by the imprint material 6 (to be referred to as the pattern of the imprint material 6 hereinafter) that has been formed using the mold 1. The lost information can be obtained by, for example, detecting the loss in the pattern of the imprint material 6 using the substrate 4 where steps (steps S301 to S310) of forming the imprint material 6 on the substrate using the mold 1 have been performed. For example, an optical or electron beam loss inspection apparatus can be used for the loss in the pattern of the imprint material 6. FIG. 16 is a view showing the lost information (lost distribution 31) in the pattern of the imprint material 6 on the shot region. Each black pixel 31a in FIG. 16 indicates the loss in the pattern of the imprint material 6. The loss in the pattern of the imprint material 6 often occurs when, for example, there is a portion which is lacking in the imprint material 6 locally or a filling time is not enough. In step S313, the control unit 8 updates the map based on the lost information obtained in step S312 such that the number of portions where the difference between the target pattern and the pattern of the imprint material 6 occurs, that is, the number of losses in the pattern of the imprint material 6 becomes smaller than a threshold. In step S314, the control unit 8 determines whether there is the substrate 4 (next substrate 4) where transfer of the pattern of the mold 1 is to be performed continuously. If there is the next substrate 4, the process advances to step S313. If there is no next substrate 4, the imprint process ends.

[Map Update]

Figure 17:
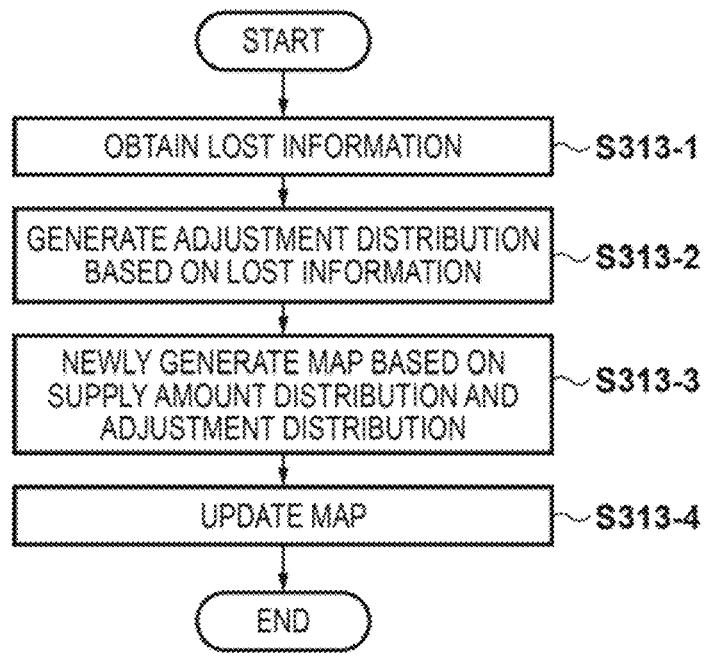
FIG. 17 is a flowchart of a map update according to the third embodiment.

A map update performed in step S313 will now be described. FIG. 17 is a flowchart of the map update. In step S313-1, the control unit 8 obtains the lost distribution 31 (lost information) shown in FIG. 16. In step S313-2, the control unit 8 generates, based on the lost information obtained in step S313-1, a distribution (adjustment distribution) for adjusting the supply amount of the imprint material 6. For example, the control unit 8 may generate the adjustment distribution such that the supply amount of the imprint material 6 increases in a portion where the loss in the pattern of the imprint material occurs. In step S313-3, based on a supply amount distribution 11 generated from the design information of the pattern of the mold 1 and the adjustment distribution generated in step S313-2, the control unit 8 newly generates a map indicating the arrangement of the droplets of the imprint material 6 that should be supplied onto the substrate. For example, the control unit 8 newly generates the map based on the adjustment distribution generated in step S313-2 such that the number of droplets of the imprint material 6 supplied to the portion where the loss in the pattern of the imprint material occurs increases. In step S313-4, the control unit 8 stores the map newly generated in step S313-3 and updates the map.

As described above, based on the lost information of the pattern formed by the imprint material that has been formed using the mold 1, the imprint apparatus according to the third embodiment updates the map indicating the arrangement of the droplets of the imprint material 6 that should be supplied onto the substrate. This makes it possible to reduce the loss in the pattern formed by the imprint material 6 that has been formed using the mold 1.

Fourth Embodiment

Figure 18:
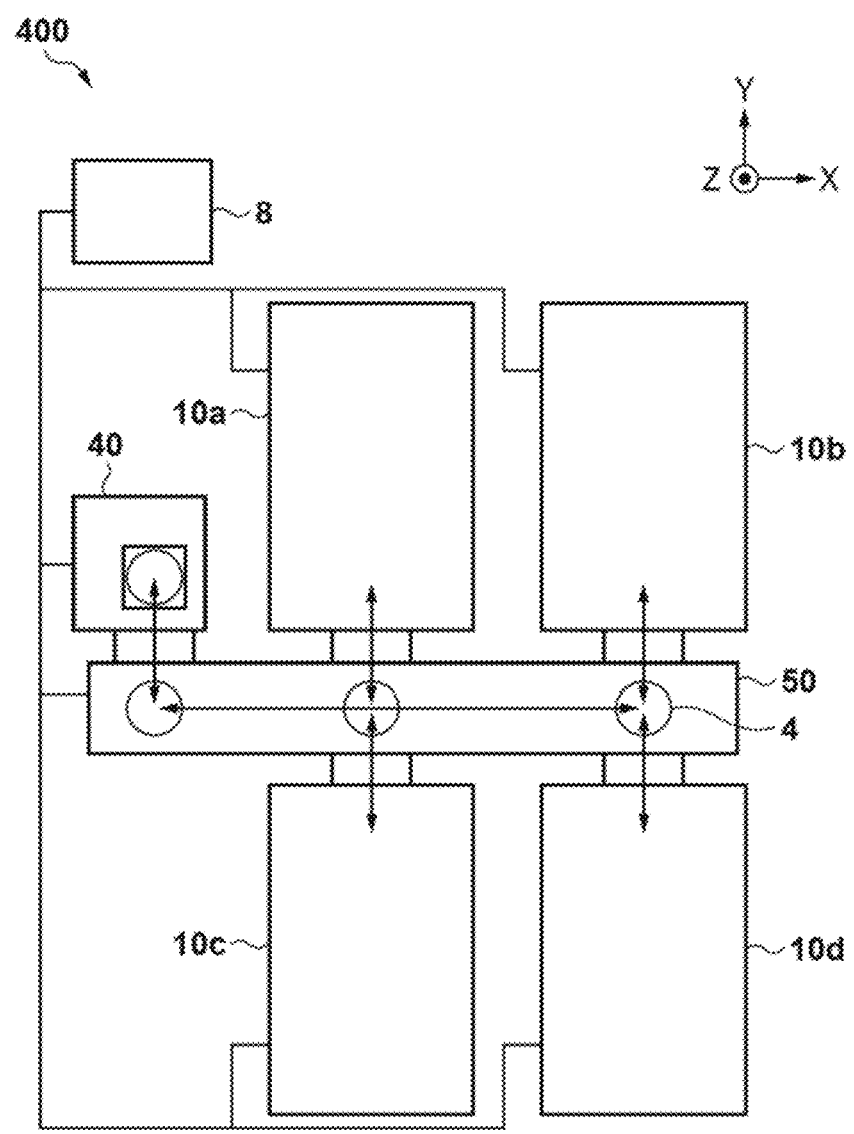
FIG. 18 is a schematic view showing an imprint apparatus according to the fourth embodiment.

An imprint apparatus 400 according to the fourth embodiment of the present invention will be described with reference to FIG. 18. FIG. 18 is a schematic view showing the imprint apparatus 400 according to the fourth embodiment. The imprint apparatus 400 according to the fourth embodiment can include a plurality of imprint units 10a to 10d each of which performs a process of transferring a pattern of a mold 1 to an imprint material 6 on the substrate, a measurement unit 40, a conveyance unit 50, and a control unit 8. Each of the imprint units 10a to 10d can include a curing unit 3, a mold stage 2, a substrate stage 5, and a supply unit 7. For example, one measurement unit 40 can be provided for a plurality of imprint units 10. The measurement unit 40 can be configured to measure the volume of each cured droplet 6a formed on the substrate as in the first embodiment or the thickness of the imprint material formed using the mold 1. The conveyance unit 50 conveys, to the measurement unit 40, the substrate 4 on which the cured droplets 6a have been formed in each of the imprint units 10a to 10d or the substrate 4 on which the imprint material 6 has been formed using the mold 1. In the thus configured imprint apparatus 400, the control unit 8 can determine a timing to convey the substrate 4 that has been processed in each of the imprint units 10a to 10d.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a resin applied to a substrate using the above-described imprint apparatus (a step of performing an imprint process on the substrate), and a step of processing the substrate onto which the pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-095502 filed on May 2, 2014, which is hereby incorporated by reference herein in its entirety.

The invention claimed is:

1. An imprint method comprising:
   forming a pattern on a substrate by discharging, from a plurality of orifices toward a substrate, an imprint material in accordance with distribution information indicating a distribution, on the substrate, of the imprint material that should be supplied onto the substrate, and curing the imprint material supplied on the substrate, while a mold is in contact with the imprint material;

obtaining discharge amount information on a discharge amount of the imprint material discharged from each of the plurality of orifices, the obtaining discharge amount information including discharging, using the plurality of orifices, the imprint material on a dummy substrate, curing the imprint material on the dummy substrate without bringing the mold into contact with the imprint material, and measuring a volume of the imprint material cured on the dummy substrate to obtain the discharge amount information; and updating, based on the discharge amount information, the distribution information such that a thickness of the imprint material formed on the substrate using the mold falls within an allowable range.

2. The method according to claim 1, wherein the distribution information indicates an arrangement of the imprint material that should be discharged as droplets from the orifices onto the substrate.

3. The method according to claim 1, wherein the distribution information indicates a density of the imprint material that should be discharged from the orifices onto the substrate.

4. The method according to claim 1, wherein the measuring of the volume of the imprint material is performed based on an interference fringe which is obtained by reference light and test light reflected from the imprint material cured on the substrate.

5. The method according to claim 1, wherein the curing of the imprint material on the dummy substrate is performed at a position between a supply unit that has the plurality of orifices and a measurement unit that performs the measuring.

6. The method according to claim 5, wherein in the obtaining discharge amount information, the discharging of the imprint material on the dummy substrate, the curing the imprint material on the dummy substrate, and the measuring the volume of the imprint material are performed successively while moving the dummy substrate.

7. The method according to claim 6, wherein a time period from when the discharging of the imprint material on the dummy substrate to when the curing of the imprint material on the dummy substrate is 0.1-0.2 sec.

8. A method of manufacturing an article, the method comprising steps of:

forming a pattern on a substrate using an imprint apparatus;

processing the substrate, on which the pattern has been formed, to manufacture the article, wherein the imprint apparatus forms a pattern in an imprint material supplied onto the substrate using a mold, and includes:

a supply unit including a plurality of orifices each of which discharges the imprint material to supply the imprint material onto the substrate; and a controller configured to control the discharge of the imprint material from each orifice of the supply unit in accordance with distribution information indicating a distribution, on the substrate, of the imprint material that should be supplied onto the substrate; and a curing unit configured to cure the imprint material, wherein the controller causes the curing unit to cure the imprint material supplied on a dummy substrate from each orifice of the supply unit, without forming a pattern using the mold, and obtains a volume of the cured imprint material as information on a discharge amount of the imprint material discharged from each orifice of the supply unit, and wherein the controller updates, based on the information on the discharge amount, the distribution information such that a thickness of the imprint material formed using the mold falls within an allowable range.

* * * * *